Dec. 16, 1969 SHOJI TAUCHI ET AL 3,484,313
METHOD OF MANUFACTURING SEMICONDUCTOR DEVICES
Filed March 23, 1966 2 Sheets-Sheet 1

INVENTORS
SHOJI TAUCHI
TAKESHI TAKAGI

BY Paul M. Craig, Jr.
ATTORNEY

METHOD OF MANUFACTURING SEMICONDUCTOR DEVICES

Filed March 23, 1966 2 Sheets-Sheet 2

INVENTORS
SHOJI TAUCHI
TAKESHI TAKAGI

BY Paul M. Craig, Jr.
ATTORNEY

United States Patent Office 3,484,313

Patented Dec. 16, 1969

3,484,313
METHOD OF MANUFACTURING SEMICONDUCTOR DEVICES

Shoji Tauchi, Kokubunji-shi, and Takeshi Takagi, Musashino-shi, Japan, assignors to Hitachi, Ltd., Tokyo, Japan, a corporation of Japan Filed Mar. 23, 1966, Ser. No. 536,887
Claims priority, application Japan, Mar. 25, 1965, 40/16,928
Int. Cl. H01l 7/44
U.S. Cl. 148—187 19 Claims

ABSTRACT OF THE DISCLOSURE

The present disclosure is directed to a method for manufacturing semiconductor devices wherein impurities including gallium or indium are diffused into a semiconductor substrate through a mask including a first portion of, for example, silicon oxide and a second portion of, for example, silicon nitride or carbon, and semiconductor devices comprising films of silicon oxide and silicon nitride covering surfaces of the semiconductor substrates.

The present invention relates to a method of manufacturing semiconductor devices, and more particularly, to the so-called diffusing process which concerns diffusing of active and/or passive impurities into semiconductor body.

Still more particularly, the present invention relates to a method of diffusion at least two different types of impurities, namely, a first and a second impurity into a semiconductor body, respectively.

Yet more particularly, the present invention relates to a method of diffusing said first and said second impurities into a semiconductor body either simultaneously or in continuous succession.

Still more partiuclarly, the present invention relates to the so-called selective diffusion process represented by diffusing both the first and the second impurities into specific portions of a semiconductor body.

The primary object of the present invention, therefore, is to provide an effective diffusion process for selectively diffusing a first and a second impurity into a predetermined area of the surface of a semiconductor body either simultaneously or successively.

More specifically, the primary object of the present invention is to provide a method of selectively diffusing a first and a second impurity into a semiconductor body without effective masking and etching, or in other words, without resorting to the photoetching step, during the process of diffusing said first and said second impurities into the semiconductor body. The present invention, therefore, is not only differentiated from the conventional methods but also is characterized, in that the masking for each diffusion of the first and the second impurities is carried out altogether prior to the diffusion of the first and the second impurities into the semiconductor body.

Another object of the present invention is to provide a specific mask structure which brings forth desirous masking effects for carrying out the aforesaid diffusions and also to provide a method of applying such specific masks to semiconductor body.

Still another object of the present invention is to provide several effective methods of manufacturing semiconductor devices.

Further objects, as well as other advantages of the present invention will be easily understood by reading the following detailed descriptions in connection with the accompanying drawings, wherein.

Figure 1:
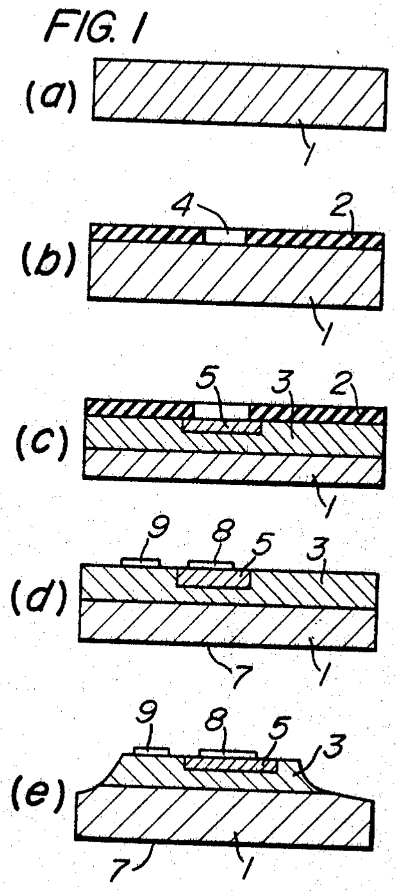
FIGS. 1, 2 and 4 represent, respectively, cross sections of a semiconductor body and masks in each step of manufacturing semiconductor devices according to a conventional method.

In the manufacture of a semiconductor device by means of a diffusion process, the techniques of diffusing at least two different impurities, namely, a first and a second impurity, into a semiconductor body, respectively, is one which is extremely important especially in the manufacture of semiconductor devices such as a transistor, and this technique has been utilized in various modes including the manufacture of double diffused transistors which are represented by mesa transistors and planar transistors.

Basically, the double diffused transistors imply such transistors which are manufactured by means of a diffusion process, an n-type (second conductivity type) or p-type base region and a p-type (first conductivity type) or n-type emitter region, respectively, on a p-type (first conductivity type) or n-type silicon wafer which is to serve as a collector. This method of forming, by means of a diffusion process, a multiplicity of base and emitter regions on a semiconductor wafer which is to serve as a collector is generally called the multiple diffusion process, and the resulting semiconductor devices are called multiple diffused semiconductor devices.

The technology of the aforesaid multiple diffusion process is further improved by the employment of either of the two different types of diffusion process which are represented by diffusing said both impurities into the semiconductor body simultaneously or in continuous succession. Such processes are disclosed in detail in the specification of the U.S. Patent No. 2,861,018. In such processes, however, the technique for providing an electrode for the base region has been a difficult problem.

As a solution to this difficulty, the application of the selective diffusion process has been found to be quite effective. In general, silicon dioxide has been useful as the material of masks for use in the selective diffusion of impurities. The employment of silicon dioxide masks in the diffusion of impurities is based on the intensive masking effect including the masking effect of the silicon dioxide on certain types of impurities, for example, boron, phosphorus, arsenic or antimony, which are diffused onto semiconductor body. Such selective diffusion process using silicon dioxide masks employs a technique which comprises diffusing said impurities mainly into the interior of a semiconductor body through the portion or portions of the surface of the semiconductor body where no silicon dioxide layer is formed. It is to be noted, however, that silicon dioxide masks have a very poor masking effect, or in other words, have no substantial masking effect, on such substance as gallium or indium when these substances are diffused thereon. Gallium diffuses into the semiconductor body irrespective of the presence of a layer of silicon dioxide, and for this reason, silicon dioxide is not used as the masking material when it is intended to diffuse gallium or indium into the semiconductor body. Such fact is utilized in the simultaneous multiple diffusion process such as the diffusion of a multiplicity of impurities through the same portion of the surface either simultaneously or successively. Such selective diffusion process is represented by the method disclosed in the specification of the U.S. Patent No. 2,802,760, and is applied chiefly in the manufacture of high frequency transistors. In the manufacture of high frequency transistors, both the base region and the emitter region are formed by multiple diffusion technique. By the use of aforesaid selective diffusion process, however, the emitter region can be formed locally within the base region. A method of manufacturing transistors comprising the combination of the aforesaid selective diffusion process and said simultaneous or successive diffusion process will be described hereunder by referring to FIGURE 1 of the drawings.

FIG. 1(*a*) represents an n-type silicon wafer 1; FIG. 1(*b*) represents a structure wherein a silicon dioxide layer 2 having a window 4 has been formed on the surface of the wafer; FIG. 1(*c*) represents n-p-n junctions formed by conducting high temperature diffusion by subjecting said wafer 1 sealed with said silicon dioxide layer 2 having a window to an atmosphere containing gallium and arsenic (or antimony) thereby diffusing arsenic (or antimony) through said window 4 of said silicon dioxide layer 2 into the wafer 1 and also diffusing gallium into said wafer 1 independently of the presence of said silicon dioxide layer 2 by utilizing the masking effect of the silicon dioxide layer 2 for the diffusion of arsenic (or antimony) and the non-masking effect of said silicon dioxide layer for the diffusion of gallium, or more specifically, by utilizing the nature of gallium which diffuses not only through said window 4 of said silicon dioxide layer 2 but also through the remainder portions of the silicon dioxide layer 2, thereby forming a p-type region on the entire surface of the wafer 1. FIG. 1(*d*) represents a structure wherein said silicon dioxide layer 2 has been removed and wherein electrodes 7, 8 and 9 for the regions 1, 3 and 5, respectively, have been formed.

However, even such an improved double diffusion process had a serious problem that had to be solved. The problem was represented by the fact that the nature of gallium of being easily diffused through the silicon dioxide layer into the entire surface of the semiconductor body led to an increase in the collector junction capacitance Cc. To prevent such an increase, it was necessary to remove the unnecessary portions of the base region 3 by means of etching to form a mesa. Such requirement gave rise to a number of undesirable problems including: an increase in the number of steps of the manufacturing process by the additional inclusion of such an etching step; lack of uniformity in the collector junction capacitances of the produced devices accruing from the difficulty in controlling the positioning, the configuration and the size of the mesa to be formed by the mesa etching; contamination of the surface of the semiconductor body due to such etching; and a deficiency due to unevenness of the surface of the semiconductor body, for example, such deficiency as is encountered when fabricating a semiconductor integrated circuit, due to the unevenness of the surface, which is undesirable in forming, on the surface of the semiconductor body, a capacitor, a resistor, an electrode and metal interconnection which is effected by interposing insulators therebetween.

As a solution to such problems accruing from the formation of mesa, the planar technique has been considered to be effective. The planar technique consists of bringing all the terminals of the p-n junction onto one surface of the semiconductor body, and such technique is, in principle, described in the specification of the U.S. Patent No. 3,025,589 which also teaches the technique of forming the region by the selective diffusion as is used in the formation of the emitter region in such mesa transistors as have been described. In view of the fact, however, that the silicon dioxide film lacks a masking effect for the diffusion of gallium into the semiconductor body, it is impossible to form a p-type base region by a local diffusion of gallium. For this reason the conventional techniques used a substance such as boron to which the silicon dioxide film had a diffusion masking effect and semiconductor devices were manufactured according to the steps as are shown in FIG. 2.

Figure 2:
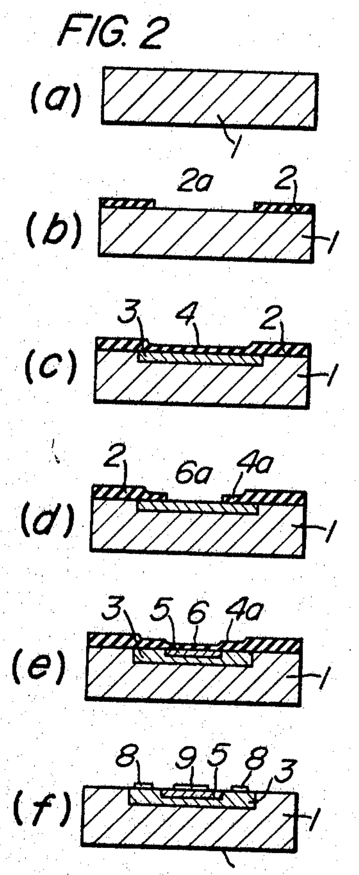

FIG. 2(*a*) represents a p-type or n-type semiconductor wafer 1 comprising a substance such as silicon or germanium said n-type will hereinafter be referred to as the first conductivity type. Also, the conductivity type opposite to said first conductivity type, namely, in case the first conductivity type is represented by p-type, the n-type, and in case the first conductivity type is represented by n-type, the p-type, is called the second conductivity type.

FIG. 2(*b*) represents a structure wherein a first silicon dioxide mask 2 having a window **2*a* is formed on the surface of said semiconductor body 1. Such first silicon dioxide mask 2 is obtained by first forming a layer of silicon dioxide on the surface of the semiconductor body 1** and by subsequently locally etching the silicon dioxide layer by known photo-engraving technique.

FIG. 2(*c*) represents a structure wherein a first diffused layer 3 of the second conductivity type has been formed selectively through said window **2*a* of the silicon dioxide layer by utilizing the masking function of the silicon dioxide mask 2 for the diffusion. Such diffusion is effected in general in an oxidizing atmosphere, and accordingly, a second silicon dioxide layer 4** is formed on the portion of the surface by the semiconductor body which has been exposed to the atmosphere by virtue of said window. This latter layer consists chiefly of silicon dioxide and contains a little of the impurity of said second conductivity type.

FIG. 2(*d*) represents a structure wherein a mask **4*a* has been formed by the window 6*a*** formed in the second silicon dioxide layer and also by the previously formed first silicon dioxide layer.

FIG. 2(*e*) represents a structure wherein a second diffusion layer 5 of the first conductivity type has been formed through said window **6*a* of the second silicon dioxide layer by utilizing the masking function of the second silicon dioxide mask 4*a* for the diffusion. Reference numeral 6** in FIG. 2(*e*) represents a silicon dioxide layer formed by said diffusion treatment. This latter silicon dioxide layer contains some of the impurity of the first diffusion.

FIG. 2(*f*) represents a structure wherein ohmic contacts 7, 8 and 9 have been formed on the regions of said semiconductor wafer, respectively, namely, on the semiconductor body 1 of the first conductivity type, the diffusion layer 3 of the second conductivity type and the second diffusion layer 5 of the first conductivity type. In a semiconductor device manufactured in this manner, said regions 1, 3 and 5 serve as the collector, the base and the emitter, respectively, while said ohmic contacts 7, 8 and 9 serve as the collector electrode, the base electrode and the emitter electrode, respectively.

While the planar technique eliminates the fault of the previously described mesa transistors, it is to be noted that the first diffusion layer 3 and the second diffusion layer 5 are formed by independent steps, respectively, and between these independent steps there is included a step of locally etching the silicon dioxide layer **4*a***, and that, accordingly, it is impossible to carry out the first and the second diffusions simultaneously or successively. This will result in an increase in the number of the steps of production plus the lack of uniformity in the electrical characteristics of the resulting devices and also in a reduction in the yield of product, due to the introduction of an impurity during the second diffusion process. In other words, while this planar technique requires no mesa formation, it is impossible to carry out, by this technique, the diffusion of two kinds of impurities simultaneously or continuously.

As a result of an intensive study on the technology of producing semiconductor devices, the inventors have found and have confirmed that in the manufacture of transistors and other semiconductor devices on an industrial basis, i.e., from the aspect of quality control including the efforts of improvement and unification of the quality of the devices to be produced and also from the aspect of reducing the number of the manufacturing steps, it is industrially effective to satisfy each of the following conditions:

(1) That at least two different impurities, namely, a first and a second impurity, can be diffussed into a semiconductor body;

(2) That said first and said second impurities can be diffused into the semiconductor body either simultaneously or in continuous succession; and (3) That said first and said second impurities can be selectively diffused into the predetermined portions or the semiconductor body, which means an improvement of the so-called selective diffusion technique.

These objects, however, could not have been attained by a mere combination of such known independent conventional methods as have been described above, because of the fact that the advantages and the disadvantages of the conventional techniques offset each other.

The present invention has made it possible to altogether eliminate these disadvantages of the conventional methods. According to the present invention, there is provided a masking process which enables the different individual impurities to be diffused selectively into a semiconductor body either simultaneously or in continuous succession.

According to the present invention, at least two different types of masks having different masking effects are formed on different portions of the surface of a semiconductor body, respectively. In such formation of masks, the substances constituting the masks are selected so that one of the masks (the first mask) has substantially no masking effect on the predetermined type of impurity when it is diffused into the semiconductor body while the other of the masks (the second mask) has a substantial masking effect on the predetermined different type of impurity when it is diffused into the semiconductor body. Accordingly, the conditions of the masks such as the type of material, the thickness of the masks to be formed are determined depending upon the type of the impurities to be diffused into the semiconductor body. For example, in the case where gallium is used as the impurity, the first mask may be comprised of silicon dioxide, and the second mask may be comprised of either carbon, or silicon nitride. As a result, gallium is diffused into the semiconductor body through the silicon dioxide layer of the first mask, while gallium is not diffused into the semiconductor body through the second mask. As a consequence, where there is a portion in which neither the first mask nor the second mask is formed, or in other words, there is an exposed surface portion in the semiconductor body, the introduction of such substance as arsenic is intercepted by the first and the second masks, and arsenic is diffused only through the exposed surface portion, or the window, of the semiconductor body. More specifically, in the case where various kinds of semiconductor devices are manufactured according to the method of the present invention, it is effective to build such first and second masks on the surface of the semiconductor body so as to leave at least one portion of the surface of the semiconductor body open, or in other words, exposed to the outside world. By this arrangement, impurities can be multiplicity diffused into the semiconductor body either simultaneously or successively one impurity after another. This permits the manufacture of the planar type semiconductor devices as well as other types of semiconductor devices of complicated structure, and furthermore, permits that a plurality of semiconductor devices having different characteristics to be manufactured simultaneously. This technique comprises basically a method of diffusing at least two different impurity, namely, a first and a second impurity, into the selected portions of the semiconductor body, respectively. More in detail, the said technique is such that at least said first and said second impurities are selectively diffused into the semiconductor body under the conditions that a first mask which has a masking effect on said first impurity when the latter is diffused into the semiconductor body but which has no masking effect on the second impurity when it is diffused into the semiconductor body, and a second mask which has a masking effect on at least the first and the second impurities when they are diffused into the semiconductor body, and further a portion which is irrelevant to the masking effect of both the first and the second masks, are applied on the surface of the semiconductor body. Furthermore, the present invention involves several improved methods of manufacturing semiconductor devices of different structure. One of them is the technique for the multiple diffusion of impurities, as has been discussed previously. Another one concerns the technique of forming different layers on different portions on the surface of a semiconductor body, respectively. Still another one concerns the technique of forming adjacent diffusion layers which have portions having different thicknesses and/or different electric conductivities. There are yet many other methods which are provided according to the present invention. These methods will be described in detail in connection with the embodiments which will be stated later.

An extremely important aspect of the present invention is that at least two types of masks having masking effects which are different from each other are applied to the surface of a semiconductor body as has been discussed above. The conditions of the masks such as the constituting material, the thickness and the size should be determined depending upon such factors as the types of the impurities to be diffused, the diffusion time, the diffusion temperature and the individual characteristics which are required of the individual semiconductor devices.

Where a substance such as boron, phosphorus, arsenic, antimony or gold is used as the first impurity and where gallium or indium is used as the second impurity, the material which is effective as the first mask is either silicon dioxide or an oxide having silicon dioxide as its main component, or other oxides or glass. Furthermore, by appropriately controlling the thickness of the mask, the diffusion temperature, the diffusion time, the atmosphere, and the conditions of the source of the impurities, one can use boron or phosphorus as the first impurity, and gallium, indium, arsenic, antimony or gold as the second impurity, wherein silicon dioxide is used as the first mask. In other words, where silicon dioxide is used as the first mask, the relationship between such mask and the first and the second impurities should be determined on the basis of the effective osmotic coefficient of these impurities to silicon dioxide. It is known that gallium is of an extremely high effective osmotic coefficient and that boron and phosphorus have a very small effective osmotic coefficient. As a consequence, where boron or phosphorus is used as the first impurity and gallium is used as the second impurity, the effective material as the first mask is silicon dioxide.

It is also known that gallium is exposed to the masking effect of carbon and silicon nitride. Therefore, where gallium is used as the second impurity, the effective second mask will be the one which is comprised of carbon or silicon nitride, and in addition to these substances metals having a high melting point such as tungsten or tantalum will also be effective. It is considered, however, that in case the second mask made of such material as silicon nitride is of a small thickness, such thin mask will have a reduced masking effect on certain types of impurities used as the first impurities. In such case, it will be quite effective to construct the second mask with the following two substances, namely, silicon nitride and silicon dioxide, the latter being the substance used as the first mask.

Both of these first and second masks may be formed by such means as evaporation, plating or pyrolysis. Certain types of masks may be obtained by converting the surface of the semiconductor body into a compound by subjecting said surface to some other element. This procedure will be described as follows.

MASK FORMATION TECHNIQUE 1

In the case where the semiconductor substrate is comprised of silicon, the silicon dioxide layer is obtained by heating the surface of the substrate at a temperature in the order of 1200° C. In the experiment, the thickness of the resulting silicon dioxide layer was found to be 1000 A. or more.

Other known techniques include pyrolysis of tetraethoxysilane, or evaporation of silicon dioxide.

MASK FORMATION TECHNIQUE 2

Where silicon is used as the substrate, the aforesaid layer of silicon nitride is obtained by heating the surface of the substrate at a temperature of 1200° C. or above, in an atmosphere containing $N_2$.

Other known techniques which are effective for forming masks include the following procedures one of which comprising the step of effecting deposition from the gas phase of silicon nitride known as $Si_3N_4$; another concerns the steps comprising passing a mixture of pure nitrogen ($N_2$) and hydrogen ($H_2$) through silicon tetrachloride ($SiCl_4$) and subsequently subjecting the mixture gas stream of these three substances to pyrolysis to cause deposition; and still another concerns the step of subjecting a mixture gas stream of a nitride and a silicon compound to chemical reaction to cause deposition.

MASK FORMATION TECHNIQUE 3

A carbon mask is obtained by the steps of passing argon into toluene, heating the resulting mixed gas at 1200° C. for 2 minutes to cause deposition of carbon. In an experiment, the formed carbon layer had a thickness of about 0.4$\mu$. Also, where silicon was used as the substrate, the layer of carbon directly deposited on the surface of the substrate presented an extremely thin layer of SiC in the boundary between the carbon layer and the substrate surface, and the surfaces were found to be completely and tightly adhered to each other.

Description will now be made on the application of the first and the second masks to the semiconductor body. Basically, first and second masks are formed in different portions of the surface of the semiconductor body as has been discussed. The methods of forming such masks are as follows.

APPLICATION OF MASKS TO SEMICONDUCTOR BODY

Method 1

In the case where such first and second masks as have been described above are formed on the surface of a semiconductor body, there may arise the fear that one or both of the masks are alloyed to the semiconductor body, or that such masks are contacted in ohmic or rectifying relation by the semiconductor body. Where there is such fear, it is effective to interpose a protective layer between these masks and the semiconductor body. For example, in the case where the second mask is made of carbon, it is effective to insert a layer of silicon dioxide between the carbon and the semiconductor body.

Method 2

In the case where there is the fear that the one or both of said first and said second masks are affected by the diffusion temperature or by the atmosphere to which they are subjected, it is effective to form a protective layer on the surfaces of the masks. For example, in the case where the second mask is comprised of a silicon nitride, it is effective to form a layer of silicon dioxide on the surface of the mask.

Method 3

In case it is necessary to consider both of the aforesaid application methods Nos. 1 and 2, it is effective to form a protective layer of, for example, silicon dioxide on both sides of any one or both of the first and the second masks.

In the aforesaid application methods Nos. 1, 2 and 3, the conditions required of said protective layers for the diffusion of impurities are such that (1) in the case the protective layer is applied to the first mask, it is necessary that the protective layer be such that it will permit at least the second impurity to pass through the protective layer, and as a consequence, the protective layer may be such that it will permit both of the first and the second impurities to pass therethrough; and that (2) in the case where the protective layer is applied to the second mask, such protective layer may be such that it will permit one or both of the first and the second impurities to pass the protective layer.

Method 4

While the second mask is required to have a masking effect on the first and the second impurities when they are diffused into the semiconductor body, there are those mask materials which permit the trespassing of only the first impurity and which do not permit the trespassing of the second impurity, and those which function in the reverse way. For example, in the case where arsenic is used as the first impurity and gallium is used as the second impurity, the layer of silicon dioxide permits the passage of the second impurity (gallium) therethrough but does not pass the first impurity (arsenic) therethrough. Also, the layer of silicon nitride has a masking effect on the second impurity (gallium) and also on the first impurity (arsenic). However, the masking effect on arsenic is smaller than that on gallium. It is, therefore, effective in such a case to have the silicon dioxide and a silicon nitride form a second mask. In other words, the aforesaid masks are made in multiple form from at least two different masking materials. In the latter case, at least one of the masking materials may be utilized as the protective layer which has been described in connection with the methods of application of masks Nos. 1 through 3, and such protective layer is effective for obtaining good results.

Method 5

As has been made clear by the foregoing descriptions, the materials which are used as the first mask include oxides such as silicon dioxide. These oxides are of satisfactory resistance to heat and also to the diffusion atmosphere. It has been made clear also that the first impurity should not penetrate the second mask. From these considerations, it is effective to use the mask material used in the first mask as the protective layer for the second mask which has been discussed in connection with the methods of application Nos. 1 through 3, and/or as one of the layers of the second mask which has been discussed in connection with the method of application No. 4.

Method 6

Concerning the foregoing methods of application Nos. 1 through 5, it is necessary that the area of contact between the semiconductor body, the protective layers of the masks, the piled up mask materials be adhered airtight to each other. In the case where these elements have a poor adhering strength, it is effective to interpose an intermediary medium therebetween. For example, in the case where it is intended to form a second mask, it is extremely difficult to have the silicon dioxide layer adhere air-tight to the carbon or silicon nitride layer. According to the method of the present invention, this difficulty is solved by, for example, interposing a thin silicon layer between the silicon dioxide layer and the carbon or silicon nitride layer. In general, silicon and silicon dioxide, silicon nitride easily adhere to each other. Furthermore, silicon and carbon rigidly adhere to each other by forming a compound, SiC, in the boundary between these two substances, as has been described previously. In the case where it is intended to form a silicon nitride layer on the silicon dioxide layer, such layer is obtained by any of the following steps: a thin silicon layer is first formed on the layer of silicon oxide by a means such as pyrolysis and subsequently the surface of the silicon layer is converted into silicon nitride by the afore-stated method, or silicon nitride is deposited on the surface of the silicon body. An almost similar technological procedure may be applied to the formation of a carbon layer on the silicon.

Other methods of successfully applying masks to semiconductor body include formation of both the first and the second masks from the same material but with different thicknesses.

Descriptions have been made in detail with respect to the masks. Now, description will be made on the application of the present invention to the manufacture of semiconductor devices.

EXAMPLE 1

This embodiment relates to the application of the present invention to the method of locally forming multiple semiconductor layers simultaneously or successively in the case of manufacturing multiple diffused semiconductor devices. More specifically, this embodiment relates to a method of diffusing at least two different types of impurities, i.e., a first and a second impurity, into a semiconductor body, wherein at least said first and second impurities are selectively diffused into the semiconductor body under the conditions that the three factors, namely, a first mask having a masking effect on said first impurity when the latter is diffused into the semiconductor body and having no masking effect on the second impurity when the latter is diffused into the semiconductor body, a second mask having a window and having a masking effect on at least said first and said second impurities when they are diffused into the semiconductor body, and a portion (a third portion) which is free from the application of any of the first and the second masks, are applied onto the semiconductor body in such manner that said first and the third portion are present at least at the site of the window of said second mask having a window.

Figure 3:
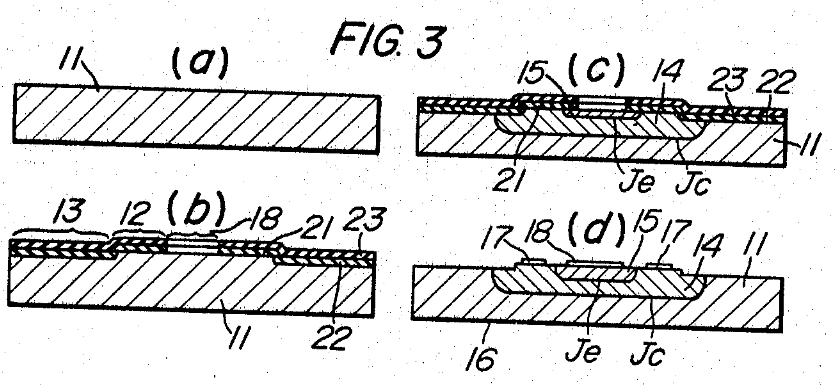
FIGS. 3 and 5 represent, respectively, cross sections of a semiconductor body and masks in each step of manufacturing semiconductor devices according to one embodiment of the present invention.

FIG. 3(*a*) of the drawings represents a semiconductor wafer 11; FIG. 3(*b*) represents a structure wherein a first mask 12 and a second mask 13 have been formed on the surface of said semiconductor wafer. FIG. 3(*c*) represents a structure wherein diffusion regions 14 and 15 have been formed in the semiconductor wafer by selectively diffusing a first and a second impurity by utilizing the masking effect of said first and said second masks. FIG. 3(*d*) represents a structure wherein ohmic contacts 16, 17 and 18 have been formed in said regions 11, 14 and 15, respectively. In a transistor having such structure, the regions 11, 14 and 15 serve as the collector region, the base region and the emitter region, respectively, while the ohmic contacts 16, 17 and 18 are used as the collector electrode, the base electrode and the emitter electrode, respectively. In the present embodiment, arsenic was used as the first impurity, and gallium as the second impurity, and n-type silicon having a resistivity of the order of 1 Ω cm. was used as the semiconductor wafer. Silicon dioxide was used as the material of the first mask 12, and a laminate of silicon nitride 22 and silicon dioxide 23 was used as the material constituting the second mask 13.

First, the n-type silicon wafer was heated at a temperature of 1100° C., or above, in a hydrogen atmosphere containing moisture. As a result, a silicon dioxide layer 21 having a thickness of several thousand A. was formed on the surface of the silicon wafer. Next, all the portions of the silicon dioxide layer 21 were removed by photoetching technique except for a portion of circular configuration having a diameter of 200$\mu$. Subsequently the resulting silicon wafer was heated at 1300° C. in nitrogen atmosphere. As a consequence, a silicon nitride layer 22 was formed on the surface of the silicon wafer which was not covered with the silicon dioxide layer 21. Next, a silicon dioxide layer 23 was formed on the surface of the silicon nitride layer 22 and silicon dioxide layer 21 by pyrolysis. This was followed by the removal of the circular portion of 100$\mu$ in diameter located at the central portion of said silicon dioxide layers 21 and 23 by photoetching technique. As a result, a mask as is shown in FIG. 3(*b*) was applied to the surface of the semiconductor wafer. Reference numeral 12 of FIG. 3(*b*) comprises silicon dioxide layers 21 and 23, and these layers serve as the first mask. The portion indicated by numeral 13 comprises a laminate of a silicon dioxide layer 23 and a silicon nitride layer 22, and serves as the second mask. The portion indicated by numeral 18 represents the portion to which neither of the two masks 12 and 13 are applied and said portion serves as the aforestated third portion.

The semiconductor wafer 11 which underwent masking treatment as described above was transferred to the diffusion step to undergo the diffusion treatment.

In this embodiment, the first impurity was comprised of arsenic, and as the source of this impurity, $As_2O_3$ was used. The second impurity was comprised of gallium and as the source of this latter impurity, $Ga_2O_3$ was used.

The masked semiconductor wafer was introduced into a diffusion furnace where it was heated at 1300° C. Said source of $Ga_2O_3$ was introduced into the diffusion furnace at a position between the entrance of said semiconductor wafer and the inlet of the carrier gas, and was heated at 1000° C. Also, $As_2O_3$ was introduced into said diffusion furnace at a position near the inlet of the carrier gas and was heated at 235° C. The heating lasted for 30 minutes. Throughout such heating process, hydrogen gas containing moisture was supplied into said furnace through the inlet of the carrier gas at the rate of 1500 cc. per minute. As a result, such diffusion layers 14 and 15 as shown in FIG. 3(*c*) were formed.

Said gallium had a diffusion coefficient which was sufficiently greater into silicon, and accordingly, gallium diffused much deeper into the semiconductor body than did arsenic. Also, gallium diffused well into the semiconductor body through the first mask 12, and as a result, the portions of the semiconductor body beneath the first mask 12 and beneath the third portion were converted into p-type, and thus a base region 14 was formed, with the collector p-n junction *Jc* being the boundary. Such collector junction *Jc* was located at a depth of about 9$\mu$ from the surface of the wafer, and the concentration of the impurity which was diffused on the surface thereof was in the order of $1\times10^{17}$ atm./cm.$^3$. It was confirmed that some gallium had been diffused in the portion beneath the second mask 13, but the amount of the diffused gallium was so trifling that it was not enough for converting the conductivity type of the semiconductor wafer 11.

Furthermore, because of the fact that the diffusion constant of arsenic was sufficiently smaller than that of gallium, as has been stated above, the diffusion of arsenic was arrested to a depth much closer to the surface of the wafer than was the depth of the diffusion layer of gallium. Also, since the quantity of the arsenic was predetermined so as to be diffused into the semiconductor wafer in a quantity substantially greater than that of the gallium, the region of the arsenic diffusion showed the conductivity to be n-type, and thus an emitter region 15 was formed beyond the boundary of the p-n junction *Je*. The depth from the surface of the wafer to the surface of the resulting emitter junction *Je* was about 2$\mu$, and the concentration of the impurity which was diffused on the surface was in the order of $2\times10^{18}$ atm./cm.$^3$. In the latter case, some arsenic was diffused in the portions beneath the masks 12 and 13, in a similar way as in the case of gallium. However, the amount of diffusion of arsenic was not enough for affecting the conductivity of the semiconductor wafer.

In the abovestated embodiment, gallium and arsenic were diffused simultaneously into the semiconductor wafer in one step. However, it is possible to effect the diffusion of gallium and arsenic separately. In such case, it is possible to appropriately select the carrier gas to suit the impurities. For example, in the aforesaid diffusion of arsenic, the carrier gas used may be either a mixture of $N_2$ gas and $H_2O$ or dry gas or $O_2$. It will be easily understood that even in the foregoing case, there is no need of forming a mask between the diffusion steps, nor is there the need of including a step of etching the silicon dioxide layer between diffusion steps.

Diffusion process which may be applied to the present invention includes various known methods, for example, diffusion in gas phase, solid phase or liquid phase either in oxidizing, reducing or inert gas atmosphere, or in vacuum. The impurities which are introduced include metals and their oxides, but other compounds such as halide or a mixture of halides may also be applied to the present invention. Furthermore, the manner of diffusion of said first and said second impurities into the semiconductor wafer which may be applied to the present invention may vary, as required, including simultaneous diffusion and successive diffusion. As still another example, the first impurity arsenic and the second impurity gallium may be used in the form of an intermetallic compound (Ga-As). In this latter case, however, it is preferred that an additional amount of gallium be used besides the said compound, since the volume of gallium to be evaporated is extremely small as compared with that of arsenic.

As is now clear from the foregoing descriptions, according to the present invention, the formation of the two masks is effected prior to the diffusion steps. According to the present invention, a plurality of different types of impurities may be diffused either simultaneously or in continuous succession into a semiconductor wafer without the need of masking and etching steps during or after the diffusion process. In other words, the present invention reduces the number of the cycles of heat treatment which comprises heating and cooling steps to only one cycle, resulting in a number of advantages, for example, reduced treatment time, reduced distortion in the interface plane between the silicon wafer and the mask layers, enhanced reliability of the products, improved yield, reduced lack of uniformity in the quality of the product, and improved reproducibility of the devices. Furthermore, in view of the fact that the main surface is fabricated into a planar structure, there is no need of effecting mesa etching. In addition, the present invention is effective also in the manufacture of high frequency semiconductor devices and semiconductor integrated circuits where electrodes are formed in the form of printed circuits on the semiconductor wafer through the intermediary of insulators.

Still further, according to the present invention, at least one or both of the masks used in the aforesaid diffusion may be retained to use them as the protecting films to shield the surfaces of the semiconductor elements from the ambient atmosphere. Usually, there exists a difference in the thermal expansion coefficient between the masks and the semiconductor body. As a consequence, where a number of heat treatment cycles, comprising heating and cooling steps, are involved as has been discussed in connection with the conventional methods of FIG. 1, stresses tend to be applied bteween the semiconductor wafer and the masks and such stresses will result in the occurence of cracks in the masks and especially in the portions of the masks around the window, or result in the separation of the masks from the semiconductor wafer, or result in the development of distortions in the surface area of the semiconductor wafer, and these factors will, in turn, contribute to a marked reduction in the reliability and the yield of the product. Also, where a diffusion and etching steps is involved, as has been discussed in connection with the conventional methods of FIG. 2, the surface protection by utilizing masks is impossible, and accordingly, an additional step of protection treatment is required. In contrast to this, where the masks are used as the protective films for the semiconductor wafer according to the present invention, the number of the heat treatment cycles, comprising heating and cooling steps, is reduced to only one cycle, and these facts permit the use of the masks as the protective films without the fear of the occurence of cracking in the masks, the separation of the masks from the semiconductor wafer and the distortions in the surface of the semiconductor wafer. In other words, the present invention is industrially valuable in that it permits the masks to be used as the protective films without the accompanyment of any reduction in the reliability and the yield. Also, while such protective film may comprise said masking layer 21 alone, protective function and the mechanical strength of a protective film may be reinforced and strengthened by using both masking layers 21 and 22 in case the masking layer 22 is an insulator, or in case the masking layer 22 has been converted into an insulator during the manufacturing process or in the case the masking layer 21 and the masking layer 23 are a fused structure. Furthermore, in case the conducting members such as the electrodes, the interconnection materials and the resistance materials are connected on such protective films, the electrostatic capacity between the semiconductor wafer and the masks can be reduced due to the greater thicknesses of the oxide and the masks than the thickness observed in the conventional planar methods, and this is advantageous in a high frequency transistor structure.

Also, in case said masking layer 21 is an insulator and said masking layer 22 is a conductor, the latter masking layer 22 can effectively be utilized as the site for said electrode, wiring member and resistance member. Such electrode, interconnection material and resistance material are formed by selectively etching said masking layer 22 by the previously stated photo-etching technique or by other techniques.

The present invention has been described chiefly as it is applied to the manufacture of transistors. It is needless to say that the present invention is not restricted thereto, and that the present invention may be applied to the manufacture of many other types of semiconductor devices having multi-diffused regions.

EXAMPLE 2

This embodiment relates to a method of forming diffusion regions having different characteristics in different portions of the surface of a semiconductor wafer, respectively. As for the conventional diffusion method which is related to this method of the present invention, the selective diffusion technique employing silicon dioxide masks is known. Such conventional selective diffusion technique will be described in connection with the manufacture of integrated transistors as follows.

Figures 4, 5:
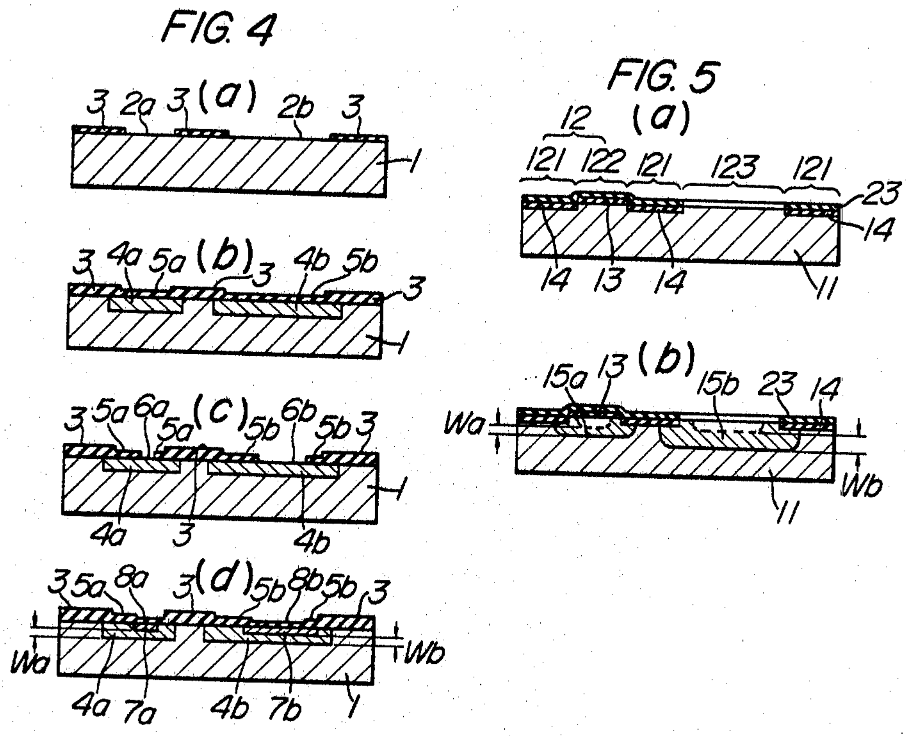

FIG. 4 shows the cross sections of a semiconductor body in each step of manufacturing integrated transistors comprising a high frequency transistor and a power transistor. FIG. 4(*a*) represents a structure wherein a first silicon dioxide mask 3 having a plurality of windows, namely, first windows 2*a* and 2*b* has been formed on the surface of a semiconductor wafer 1. FIG. 4(*b*) represents a structure wherein p-type regions 4*a* and 4*b* have been formed in the semiconductor wafer by selectively diffusing boron, an acceptor impurity, through said windows 2*a* and 2*b* onto the surface of the silicon wafer, utilizing said silicon dioxide mask 3. This diffusion is effected in an oxidizing atmosphere, and as a consequence, second silicon dioxide layers 5*a* and 5*b* are formed at the sites of the first windows 2*a* and 2*b*. FIG. 4(*c*) represents a structure wherein second windows 6*a* and 6*b* have been formed in said second silicon dioxide layers 5*a* and 5*b*. FIG. 4(*d*) represents a structure wherein n-type layers 7*a* and 7*b* have been formed by selectively diffusing arsenic, a donor impurity, through said second windows 6*a* and 6*b*, utilizing said silicon dioxide masks 3, 5*a* and 5*b*. This diffusion is conducted, in general, in an oxidizing atmosphere, and accordingly, the third silicon dioxide layers 8a and 8b are formed at the sites of said second windows 6a and 6b. In a semiconductor device thus obtained, the portion indicated by reference numeral 1 operates as the collector region of the high frequency transistor and the power transistor; the portions indicated by numerals 4a and 7a operate as the base region and the emitter region, respectively, of the high frequency transistor; and the portions indicated by the numerals 4b and 7b operate as the base region and the emitter region, respectively, of the power transistor. Also, an electrode is attached to each of said regions and thus a complete device is formed. Said silicon dioxide masks are either removed prior to the attachment of the electrodes, or are retained to utilize them as the protective films.

The aforestated conventional method is suited where a number of semiconductors are manufactured simultaneously. Where at least two semiconductor elements which are of different electric characteristics are manufactured simultaneously as in the case of the manufacturing of a high frequency transistor and a power transistor simultaneously in a semiconductor wafer as has been described above, such conventional method is disadvantageous in the points stated below.

In the aforementioned transistor region, for example, it is desirable that particularly the thickness (Wa) of the base region be small, while in the aforestated power transistor region, it is preferred that the thickness (Wb) of the base region 4b be greater than the thickness (Wa) of the base region of said high frequency transistor, or that a high resistance layer be interposed between the base region 4b and the collector region. According to the aforesaid conventional method, however, the base regions 4a and 4b, as well as the emitter regions 7a and 7b, are formed simultaneously, resulting in that the thickness (Wa) and (Wb) of the base regions 4a and 4b are, undesirably, equal to each other.

Also, in many other semiconductor devices and in many integrated circuits, it is often demanded that the electric characteristics of the portions of the semiconductor wafer which are located at different sites and which are independent of each other and the electric characteristics of the portions of the semiconductor wafer which are located in adjacent relation relative to each other, be varied.

As a technique which eliminates the disadvantage as has been described above of the conventional methods and which can satisfy the demand as has been described in the preceding paragraph, the following method is known.

Such known method will be described with respect to the integrated circuit comprising a high frequency transistor and a power transistor as shown in FIG. 4. This method comprises the steps of first applying a silicon dioxide mask having only one window 2b to the surface of a semiconductor wafer; diffusing boron into this semiconductor wafer through said window to a considerable depth to form a base region 4b having a substantial thickness; subsequently forming a window 2a in the layer of silicon dioxide; and diffusing boron slightly through this window to form a thin base region 4a, thereby substantially achieving $Wa<Wb$.

Such conventional method has the drawbacks that (1) the formation of the windows 2a and 2b which is effected in separate steps results in fact that the size of the windows tends to lack uniformity and that this fact, together with the subsequently formed windows 6a and 6b, contributes to the lack of uniformity in the electric characteristics of the product; and that (2) the number of the processing steps is increased by the inclusion of the step represented by the processing of the silicon dioxide layers between each diffusion step. These factors (1) and (2) are only contributory to the reduction in the yield and, accordingly, in a marked increase in the cost.

The present invention provides a method which altogether solves these antagonizing defects of the conventional methods. The purport of the present invention lies in that in a method of forming, within a semiconductor body, diffusion layers which are adjoining the semiconductor body by diffusing at least two different types of impurities, i.e., a first impurity and a second impurity, into said semiconductor body, said first and said second impurities are selectively diffused into the semiconductor body under the conditions that a first mask having a masking effect on said first impurity when the latter is diffused into said semiconductor body but having no masking effect on said second impurity when the latter is diffused into the semiconductor body, a second mask having a masking effect on said first impurity and also on said second impurity when these impurities are diffused into the semiconductor body, and a third portion free from the application of said first mask and said second mask, are applied to the semiconductor body in such manner that said first mask is located in a separate relation from said third portion, said diffusion being effected in such manner that said first impurity and said second impurity are diffused through said third portion on one hand, and that said second impurity is diffused through said second mask on the other hand.

As is clear from the foregoing description of the purport of the present invention, the aforesaid method of the present invention is not restricted only to the manufacture of the integrated circuit devices which comprise a high frequency transistor and a power transistor which have been previously described, but, as is needless to say, the present invention may be applied to many other semiconductor devices and, especially, to all of such semiconductor devices as those having diffused impurity regions in different portions of the semiconductor body and having different electric characteristics relative to each other. For the convenience of description, discussion will be made to such integrated transistor devices, as shown in FIG. 4, so formed as to be $Wa<Wb$, by referring to FIG. 5.

FIG. 5(a) represents a structure wherein masks have been applied to the surface of a semiconductor body. Reference numeral 11 represents the semiconductor substrate which may comprise any known semiconductor including germanium and silicon. The conductivity type may be selected, as desired, from n-type, p-type, i-type and their combinations. In this example, however, n-type is used. Reference numeral 12 represents the masking area, and particularly, numeral 121 represents a second mask; numeral 122 represents a first mask; and numeral 123 represents a third portion which is free from the application of both the first mask and the second mask and which is exposed to the outer world. These masks may be comprised of any of the previously described mask materials and may be formed by any of the previously described formation techniques. Of the masks shown in FIG. 5 of the embodiment of the present invention, those which are indicated by numerals 13 and 14 correspond to the masks 21 and 22 in FIG. 3, respectively.

The first impurity and the second impurity which are diffused in the embodiments of the present invention may arbitrarily selected, as required, from the donor impurities, acceptor impurities and further from the impurities which are suited for varying the electric characteristics, for example, the life time. The materials of said masks 121 and 122 are determined depending upon the type of the impurities to be used. For example, boron which is an acceptor impurity may be used as the first impurity and gallium which is an acceptor impurity may be used as the second impurity.

FIG. 5(b) represents a structure wherein diffusion regions 15a and 15b have been produced by diffusing the first impurity and the second impurity into the semiconductor substrate 11 by utilizing the masking area 12. Such diffusion may be effected by any of the various known methods, for example, gas phase, solid phase or liquid phase diffusion either in oxidizing, reducing or inert gas atmosphere, or in vacuum. Also, the introduction of impurities may be effected in various forms, such as metals, oxides, or other compounds or their mixtures. Furthermore, the first impurity and the second impurity are diffused into the semicinductor substrate in continuous succession. As stated previously, between the first diffusion and the second diffusion, there is included no step of etching the layers of the silicon dioxide masks, and accordingly, diffusion can be effected continuously. Furthermore, by appropriately predetermining the amount of the first and the second impurities to be diffused in connection with the diffusion coefficient of these substances, the relation of $Wa<Wb$ as shown in FIG. 5(*b*) can be achieved even when these two types of impurities are diffused simultaneously into the semiconductor substrate. Other designing plans may be made in a manner similar to those done in the conventional methods. As for the manufacturing techniques, the one which is shown in Example 1, as well as those which have been described already in those parts of this specification preceding to said Example 1, may be applied to, as desired.

Such methods of the present invention are not restricted only to the manufacture of the integrated circuit devices comprising a high frequency transistor and a power transistor as have been described, but, as is needless to say, the methods of the present invention are also applicable to all other semiconductor devices which require the formation of diffusion regions having different electric characteristics in different portions of a semiconductor body.

What is claimed is:

1. In a method of manufacturing semiconductor devices comprising the steps of masking and diffusing impurities into selected portions of a given conductivity semiconductor body by heat treatment, wherein the improvement comprises forming a mask including a first portion and a second portion onto different portions, respectively, of the surface of said semiconductor body prior to effecting said diffusion of said impurities, said first portion of the mask consisting essentially of silicon oxide, said second portion of the mask comprising a first layer consisting essentially of at least one substance selected from the group consisting of silicon nitride and carbon, and said impurities including a first impurity selected from the group consisting of gallium and indium, whereby said first portion of the mask has substantially no masking effect on said first impurity.

2. A method according to claim 1, wherein said second portion of said mask further includes a second layer of the same material as that of said first portion of said mask.

3. A method according to claim 2, wherein said one of the first and second layers of said second portion of the mask is in contact with the surface of said semiconductor body.

4. A method according to claim 2, wherein said one of the first and second layers of said second portion of the mask is formed at the outermost periphery of said second portion of the mask in such a manner that said one of the layers covers the remainder of layers.

5. In a method of manufacturing semiconductor devices comprising the steps of masking and diffusing impurities into selected portions of a given conductivity semiconductor body by heat treatment, wherein the improvement comprises applying first and second masks onto different portions of the surface of the semiconductor body prior to said diffusion, said first mask consisting substantially of silicon oxide and said second mask consisting essentially of a silicon nitride, subjecting the resulting structure to heat treatment in an atmosphere containing gallium, thereby diffusing gallium mainly into the portion of the semiconductor body beneath the mask consisting essentially of silicon oxide to change the conductivity.

6. A method according to claim 5, wherein a silicon nitride layer is selectively formed on the portion of the surface of the semiconductor body where there is no layer of silicon oxide.

7. A method according to claim 5, wherein another layer of silicon oxide is formed on both of said silicon nitride layer and said silicon oxide layer.

8. A method according to claim 6, wherein a window is formed in said layers of silicon oxide after the formation of said silicon nitride layer, to expose the surface of said silicon semiconductor body to the ambent environment.

9. A method according to claim 1, wherein said second portion of the mask comprises a second layer of silicon oxide formed on the surface of the semiconductor body, a layer of semiconducting substance formed on said second layer of silicon oxide, and said first layer formed on the latter layer of semiconducting substance.

10. A method according to claim 1, wherein said second portion of the mask used in said diffusion is retained eventually on the surface of the semiconductor body, thereby protecting the surface of the semiconductor body from the ambient atmosphere.

11. A method according to claim 8, wherein the layer of silicon oxide and the layer of silicon nitride are eventually retained on the surface of the semiconductor body, thereby protecting the surface of the semiconductor body from the ambient atmosphere.

12. A method according to claim 1, wherein the improvement further comprises that said impurities further include a second impurity selected from the group consisting of boron, phosphorus, arsenic, antimony and gold, that said mask has a third portion exposing a surface portion of said semiconductor body, whereby said first and said second portions of said mask have a masking effect on said second impurity when these impurities are diffused into the semiconductor body, and said third portion of said mask has substantially no masking effect on said first impurity and on said second impurity when these impurities are diffused into the semiconductor body.

13. A method according to claim 12, wherein said second portion of said mask has a window, and said first and third portions of said mask are applied to the semiconductor body within the site of said window of said second mask.

14. A method according to claim 12, wherein said second and third portions of said mask are separated from each other by virtue of said first portion of said mask.

15. A method according to claim 1, wherein an insulating protective layer is interposed between said first layer of said second portion of said mask and the semiconductor body.

16. A method according to claim 1, wherein a protective layer consisting substantially of silicon oxide is applied on said first layer of said second portion of said mask.

17. A method according to claim 15, wherein the insulating protective layer comprises an oxide containing at least silicon oxide.

18. A method for manufacturing semiconductor devices comprising the steps of preparing a mask on a surface of a semiconductor substrate, said mask comprising a first portion consisting essentially of silicon oxide, a second portion including a layer consisting essentially of at least one substance selected from the group consisting of silicon nitride and carbon, and a hole extending to the surface of said substrate, said first and second portion of said mask covering different surface portions of said semiconductor substrate; and causing a plurality of impurities to diffuse into said substrate, said impurities including at least one first element selected from the group consisting of gallium and indium and at least one second element selected from the group consisting of boron, phosphorus, arsenic, antimony and gold, said first element diffusing through said first portion and said hole of said mask into said substrate and said second element diffusing through said hole of said mask into said substrate.

19. A method for manufacturing semiconductor devices comprising the steps of preparing a mask on a surface of a semiconductor substrate, said mask comprising a first portion consisting essentially of silicon oxide, a second portion including a layer consisting essentially of at least one substance selected from the group consisting of silicon nitride and carbon, and a hole extending to the surface of said substrate, said first and second portion of said mask covering different surface portions of said semiconductor substrate; causing a first impurity to diffuse into said substrate, said first impurity being one of a first element selected from the group consisting of gallium and indium, and a second element selected from the group consisting of boron, phosphorus, arsenic antimony and gold; and then causing a second impurity to diffuse into said substrate, said second impurity being the other of said first and second elements; said first element diffusing through said first portion and said hole of said mask into said substrate and said second element diffusing through said hole of said mask into said substrate.

References Cited

UNITED STATES PATENTS

| | | | |
|---|---|---|---|
| 3,183,129 | 3/1965 | Tripp | 148—187 X |
| 3,341,378 | 9/1967 | Gerlach et al. | 148—187 |
| 3,342,650 | 9/1967 | Seki et al. | 148—187 |
| 3,352,726 | 11/1967 | Luce | 148—187 |
| 3,347,719 | 10/1967 | Heywang | 148—187 |

L. DEWAYNE RUTLEDGE, Primary Examiner

R. A. LESTER, Assistant Examiner

U.S. Cl. X.R.

29—578; 117—200